United States Patent

[11] 3,628,527

[72] Inventor Laurice J. West
Levittown, Pa.
[21] Appl. No. 864,769
[22] Filed Oct. 8, 1969
[45] Patented Dec. 21, 1971
[73] Assignee Microcom Corporation
Horsham, Pa.

[54] BIOLOGICAL ELECTRODE AMPLIFIER
5 Claims, 3 Drawing Figs.

[52] U.S. Cl. .......... 128/2.06 B, 128/2.06 E, 128/2.1 E, 128/DIG. 4, 330/12, 330/17, 330/19
[51] Int. Cl. .......... A61b 5/04
[50] Field of Search .......... 128/2.06 B, 2.06 E, 2.06 R, DIG. 4; 330/12, 17, 19; 174/68.5

[56] References Cited

UNITED STATES PATENTS

| | | | |
|---|---|---|---|
| 3,500,823 | 3/1970 | Richardson et al. .......... | 128/2.06 E |
| 3,528,405 | 9/1970 | Schuler .......... | 128/2.1 R |

FOREIGN PATENTS

| | | | |
|---|---|---|---|
| 1,164,770 | 5/1958 | France .......... | 128/2.06 E |

*Primary Examiner*—William E. Kamm
*Attorney*—Paul and Paul

ABSTRACT: An apparatus is disclosed comprising an electrode for detection of biopotentials, and a high-input impedance, low-noise amplifier packaged with and in direct contact with the electrode, the input terminal of the first active device of the amplifier being epoxy bonded to the electrode. The amplifier is designed with thick film resistors, and without any capacitors, thus minimizing noise generation in the amplifier.

INVENTOR.
Laurice J. West
BY
Paul & Paul
ATTORNEYS.

BIOLOGICAL ELECTRODE AMPLIFIER

BACKGROUND OF THE INVENTION

1. Field of the Invention

This invention lies in the field of electronic sensors and more particularly, an improved physiological data monitoring sensor having extremely low noise characteristics.

2. Description of the Prior Art

Physiological data monitoring systems have conventionally been characterized by electrodes placed upon the subject, generally with an electrically conductive paste applied between the electrode and the skin of the subject in order to reduce the effective source impedance of the electrode. The biopotential signals from the electrodes thus applied are generally transmitted through wires to electronic amplifier apparatus and subsequently to electronic processing apparatus. Such physiological data monitoring systems are perfectly adequate in clinical applications where the subject can be confined in a relatively stationary state, and large electrodes can be employed. However, it has become increasingly important to so monitor subjects who are free to move and, indeed, are to be monitored while moving under a variety of circumstances. Consequently, the practice has arisen of providing radio transmission from the body of the subject to a remote receiver, where amplification and data processing can then be completed. Such radio systems require a high degree of miniaturization and, in particular, extremely low noise amplification of the biopotential signals prior to radio transmission.

In pursuit of the objective of a low-noise amplifier for use in such a radio, or biotelemetry system, high input impedance integrated circuit amplifiers have been combined and packaged together, thus producing an electrode-amplifier having desirable impedance characteristics and voltage gain at the signal source. See "Biotelemetry in Medical Monitoring," Sipple, et al., Archives of Physical Medicine and Rehabilitation, Vol. 48, Sept. 1967. While considerable noise reduction is achieved by this design, due to decreasing the coupling between the electrode and the amplifier, the noise referred to the input remains on the order of 2 microvolts or less. A considerable increase in signal to noise ratio and data obtained can be achieved by further reduction of the noise referred to the input. It is most important that the noise introduced at the point of coupling the electrode to the amplifier input, and in the initial stages of the amplifier itself, be reduced to an absolute minimum. The integrated circuit amplifier used thus far in such biomedical applications introduces additional noise at the point of coupling to the first active stage of the amplifier, and in the resistive elements contained within the amplifier.

SUMMARY OF THE INVENTION

The primary object of this invention is to provide apparatus for the detection and amplification of biopotential signals, providing an output of maximum signal to noise ratio suitable for radio transmission.

It is a further object of this invention to provide an electrode combined with an amplifier wherein the input terminal of the first active device of such amplifier is coupled directly with such electrode, thereby minimizing induced noise in the coupling between the electrode and the amplifier input.

It is a further object of this invention to provide an electrode combined with an amplifier wherein such amplifier has direct coupled stages, having included therein no capacitors, and utilizing thick film resistors having optimal noise characteristics.

Accordingly, this invention provides apparatus comprised of a gold plated case, one side of such case acting as an electrode to sense biopotential signals, and containing therein a low noise amplifier, having its input terminal directly adjoining said case. The amplifier is comprised of two stages, the first stage containing a field effect transistor as the active device, the output of which is direct coupled to the base input of a second stage transistor. The resistive components of the amplifier are thick film resistors formed on a ceramic substrate. The input gate terminal of the field effect transistor is coupled electrically to the gold plated electrode by conductive epoxy, thus providing a minimum input connection and minimal susceptibility to induced noise. By elimination of any component connected between the amplifier input terminal and the electrode and providing capacitive coupling at a later stage, a substantial improvement in signal to noise ratio is achieved.

DESCRIPTION OF THE PREFERRED EMBODIMENT

Figure 1:
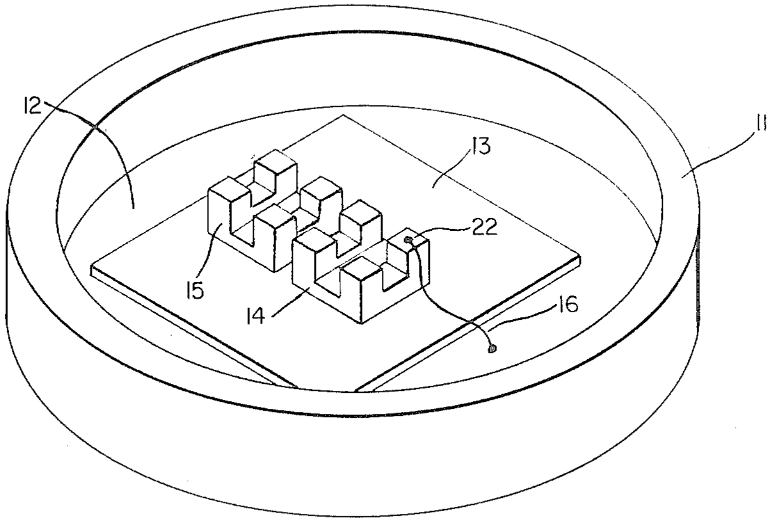
FIG. 1 is a perspective view of the construction of the amplifier in combination with the gold plated electrode case.

Referring now to the drawings, FIG. 1 shows a gold plated case 11 in which is contained an amplifier. The case 11 is comprised of aluminum or any other satisfactory conductor, plated with gold. It has been found that gold has desirable properties when used on electrodes which are placed in contact with human skin, since the gold does not corrode and does not otherwise react with the human body. The case has the form of a hollow cylinder, one flat side of which forms the electrode 12, the outside surface of which is placed in contact with the subject. On the inward side of said electrode surface 12 a ceramic substrate 13 is attached by a nonconducting epoxy. The ceramic substrate is comprised of a thick film of alumina, being approximately 0.025 inches thick. The resistive components of the amplifier are comprised of thin films of resistive ink which is screened onto the substrate by conventional techniques. The active elements of the amplifier are a LID FET 14 (Leadless Inverted Device, Field Effect Transistor), the FET being the active device of the first stage, and LID transistor 15 which is the active device of the second stage of the amplifier.

Still referring to FIG. 1, an input connection 16 is shown connecting FET 14 to the inward side of the electrode 12. Such connection is composed of a conductive epoxy, and couples the electrode 12 directly to the input, or gate 22 of FET 14. Due to the physical proximity of gate 22 to electrode 12, the epoxy coupling is of extremely small length, thus reducing noise pickup. As an added advantage, the conductive epoxy is heated at a low temperature of approximately 80° F., thus avoiding high temperature processes which tend to leave components more noisy.

Figure 2:
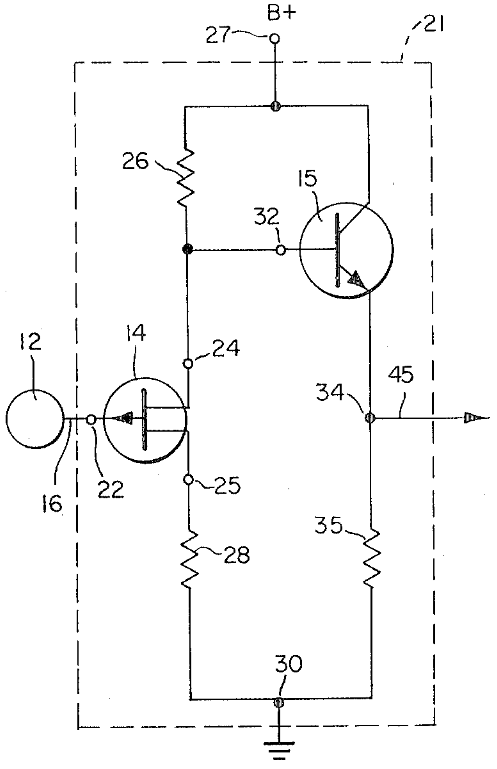
FIG. 2 is a schematic diagram of the preamplifier.

Referring now to FIG. 2, a two-stage direct coupled amplifier 21 is shown in schematic form. FET 14 is the first active device of the amplifier, having a gate terminal 22, drain terminal 24 and source terminal 25. The gate terminal 22 is in direct contact with the signal source or electrode 12 through the conductive epoxy connection 16. It is particularly to be noted that no other electrical element is ties onto gate terminal 22, such as a resistor or capacitor, which would contribute additional noise. Further, there is no shunting resistor from gate terminal 22 to ground. The drain terminal 24 is coupled to power supply 27 through resistor 26, and the source terminal 25 is coupled to ground 30 through resistor 28.

FET 14 has a high input impedance, such that the impedance seen looking into gate terminal 22 is on the order of 50 megohms. The output from the first stage developed at drain terminal 24 is direct coupled into the base terminal 32 of transistor 15. The collector of transistor 15 is tied directly to power supply 27, and the output is developed at the emitter terminal 34 across resistor 35 which is connected between terminal 34 and ground 30. Resistors 26, 28 and 35, having typical values of 10K, 400, and 30K respectively, are thick film resistors screened onto the ceramic substrate 13. The advantage of the thick film resistor in this application is that it is an extremely low noise element. Consequently, the noise introduced in the two-stage amplifier is minimized. The gain of the two-stage amplifier 21 is approximately 10 and the output is of relatively low impedance, making a good match for transmission of the signal through a wire to a remotely positioned amplifier.

Figure 3:
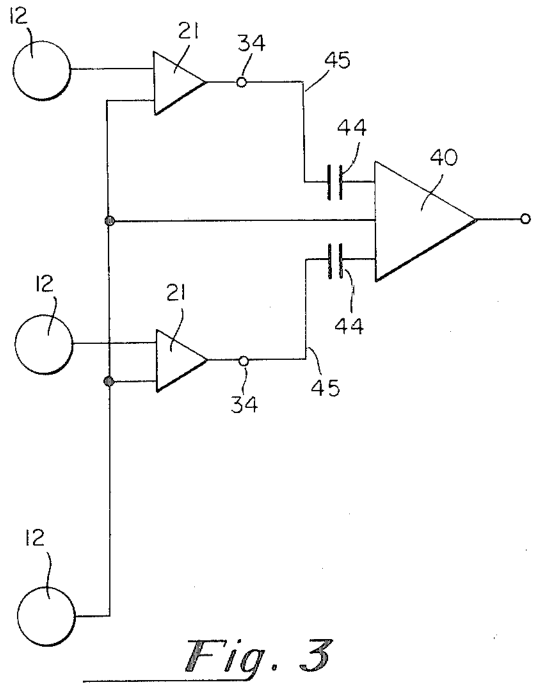
FIG. 3 is a schematic diagram showing three electrodes and accompanying amplifier connections.

FIG. 3 shows an overall block diagram showing the manner in which the electrode amplifiers are utilized in a typical application. Three cases 11 are shown which are attached to different positions on the subject's body. The electrode surface 12 of each case is simply pressed against the skin, and may be so held in place by Scotch tape or any other convenient apparatus. It is unnecessary to use paste between the skin and electrode, as is commonly done to reduce the effective skin impedance. One of the electrodes acts as a reference electrode, providing a reference potential commonly adopted as ground. The other two electrodes have combined therewith an amplifier 21 packaged within the case. The output signal from each amplifier 21 is coupled by lead 45, along with a third wire from the ground electrode, to a differential amplifier 40, conveniently placed at any point on the body. Capacitor 44 filters any DC component of the signal developed at output terminal 34. Differential amplifier 40 is a conventional integrated circuit common mode operational amplifier, which provides sufficient amplification such that the resulting signal may then be modulated for radio transmission to a remote receiver.

The manner in which this invention achieves its objectives can now be seen clearly. Due to the high input impedance looking into amplifier 21, it is not necessary to take the normal elaborate steps to reduce the effective electrode source impedance. The electrode can be made quite small, and can be placed directly into contact with the skin, without any need for intervening paste. More particularly, the manner of physically placing the gate terminal 22 of the input FET in a position directly adjoining the electrode reduces to a minimum the induced input noise which, if present, is amplified in the first stage and all succeeding stages. It is, of course, of critical importance to reduce the input noise level, particularly where biopotentials of a millivolt and less must be picked out of the noise and amplified. Further, by utilizing an FET and thick film resistors, which are inherently low noise, minimum noise is introduced in the critical first stages of amplification. Any undesired DC components which pass through the two direct coupled stages of amplifier 21 are filtered out by capacitor 44 prior to amplification by the differential operational amplifier. Further, by utilizing an emitter follower to drive lead 45, good matching is provided, further reducing susceptibility of noise.

It will be understood that the basic electrode amplifier of this invention can be utilized in a variety of physiological data monitoring applications. While the embodiment shown in FIG. 3 utilizes three electrodes and two amplifiers, any number of such electrode amplifiers may be utilized according to the clinical problem. The small size of the electrode makes it adaptable as a sensor in electrocardiography and electroencephalography. The small case and the excellent signal to noise characteristics obtained with this invention make it ideally suited for monitoring mobile subjects where shielded leads and heavy cases would be a distinct impediment.

Although the amplifier in the preferred embodiment has been described as having two stages, additional stages could be utilized. If more than two stages are so utilized, capacitance coupling may be employed in the later stages, as the noise introduced by a capacitor would be insignificant after several stages of amplification.

I claim:

1. Apparatus for detection and amplification of biopotential signals comprising:

a. amplifier means having an input terminal and an output terminal, and having a plurality of stages, each stage containing an active device, said input terminal being the input terminal of the active device of the first stage thereof;
b. case means, within which said amplifier means is encased;
c. electrode means, said electrode means being a surface of said case means, the outward side of said surface adapted to be placed in contact with a subject;
d. said amplifier means being attached to the inward side of said electrode means, and having said input terminal directly adjoining said electrode means;
e. coupling means, whereby said input terminal is coupled directly to said electrode means; and
f. said detected and amplified signals being developed at said output terminal.

2. The apparatus according to claim 1 wherein said coupling means comprises conductive epoxy.

3. The apparatus according to claim 1 wherein said amplifier means contains resistive elements, each of which is a thick film element, contains no capacitors, and incorporates direct coupling between stages, thereby achieving high signal-to-noise performance.

4. The apparatus according to claim 1 wherein said electrode means is a plate of gold coated conductive material.

5. Apparatus for monitoring and amplifying physiological electrical signals, comprising:

a. amplifier means, comprising a first plurality of low-noise amplifiers, for amplifying a plurality of electrical signals;
b. case means, comprising a second plurality of cases, each of said amplifiers being encased in a separate respective case;
c. each of said cases having a surface comprising an electrode adapted for contact with human skin and detection of physiological electrical signals;
d. each of said amplifiers having a plurality of stages, each stage having an active device, and each of said amplifiers having an input terminal which is the input terminal of the active device of the first of said stages and which is positioned directly adjoining its respective electrode;
e. first coupling means, whereby said input terminal of each of said amplifiers is coupled to its respective directly adjoining electrode by conductive epoxy;
f. differential amplifier means, having a plurality of input terminals and a ground terminal;
g. second coupling means, whereby the output of each of said amplifiers is coupled to a respective one of said input terminals of said differential amplifier means; and
h. one of said electrodes providing a reference potential, said reference electrode being coupled to said ground terminal of said differential amplifier means.

* * * * *